United States Patent
Saw

(10) Patent No.: US 8,054,141 B2
(45) Date of Patent: Nov. 8, 2011

(54) METHOD AND CIRCUIT FOR CANCELLING OUT COMPARATOR-DELAY IN THE RELAXATION OSCILLATOR

(75) Inventor: Sooping Saw, The Colony, TX (US)

(73) Assignee: STMicroelectronics, Inc., Carrollton, TX (US)

(\*) Notice: Subject to any disclaimer, the term of this patent is extended or adjusted under 35 U.S.C. 154(b) by 74 days.

(21) Appl. No.: 12/627,826

(22) Filed: Nov. 30, 2009

(65) Prior Publication Data
US 2010/0164638 A1 Jul. 1, 2010

Related U.S. Application Data

(60) Provisional application No. 61/204,023, filed on Dec. 31, 2008.

(51) Int. Cl.
*H03K 3/26* (2006.01)
(52) U.S. Cl. ......... 331/111; 331/143; 331/153; 331/173
(58) Field of Classification Search .................. 331/111, 331/143, 153, 173
See application file for complete search history.

(56) References Cited

U.S. PATENT DOCUMENTS

| | | | | |
|---|---|---|---|---|
| 6,211,746 B1 * | 4/2001 | Segawa et al. | | 331/143 |
| 7,109,804 B2 * | 9/2006 | Mader et al. | | 331/16 |
| 7,135,937 B2 * | 11/2006 | Mitsuda | | 331/143 |
| 7,138,880 B2 * | 11/2006 | Ma et al. | | 331/143 |
| 2010/0090772 A1 * | 4/2010 | Hu et al. | | 331/143 |

\* cited by examiner

*Primary Examiner* — Joseph Chang
*Assistant Examiner* — Jeffrey Shin
(74) *Attorney, Agent, or Firm* — Lisa K. Jorgenson; William A. Munck

(57) ABSTRACT

A relaxation oscillator includes a capacitor connected to a comparator input, current sources switched to supply power to the capacitor based on an output of the comparator, and a duplicate integrator shifting a voltage on the capacitor to offset a propagation delay through the comparator. The duplicate integrator includes current sources and a capacitor matching and switched in tandem with those within the relaxation oscillator, plus an additional current source, and is selectively switched into connection with the comparator input. By canceling the comparator propagation delay, the oscillator output frequency can be stably controlled through selection of resistive and capacitive values, using cheaper technology and tolerating large temperature, voltage and process variations.

20 Claims, 4 Drawing Sheets

METHOD AND CIRCUIT FOR CANCELLING OUT COMPARATOR-DELAY IN THE RELAXATION OSCILLATOR

CROSS-REFERENCE TO RELATED APPLICATION(S) AND CLAIM OF PRIORITY

The present application is related to U.S. Provisional Patent Application No. 61/204,023, filed Dec. 31, 2008, entitled "METHOD AND CIRCUIT FOR CANCELLING OUT COMPARATOR-DELAY IN THE RELAXATION OSCILLATOR." Provisional Patent Application No. 61/204,023 is assigned to the assignee of the present application and is hereby incorporated by reference into the present application as if fully set forth herein. The present application hereby claims priority under 35 U.S.C. §119(e) to U.S. Provisional Patent Application No. 61/204,023.

TECHNICAL FIELD

The present disclosure is directed, in general, to resistive-capacitive relaxation oscillators, and more specifically, to canceling propagation delay within such an oscillator.

BACKGROUND

Relaxation oscillators capable of generating a very precise and stable oscillation frequency may be implemented using stable resistive and capacitive components together with a threshold device, such that the capacitance charges gradually and discharges rapidly. The resonant frequency of a conventional resistive-capacitive (RC) relaxation oscillator is derived from a time constant based on the resistive and capacitive components. In relaxation oscillator embodiments utilizing a comparator, the comparator contributes to overall non-zero propagation delay and adds to the period of the oscillator output. However, the propagation delay of a comparator may vary with temperature, supply voltage, input slew rate, input bias levels, parasitic capacitance, process corners, and other variables. This limitation complicates generation of a precise and stable oscillation frequency in a comparator-based relaxation oscillator.

One approach to achieving a very precise output frequency with a comparator-based relaxation oscillator is to make the comparator propagation delay negligibly small relative to the RC time constant. In addition to being difficult to implement, very fast comparators (with a proportionately small propagation delay) consume significant power. In addition, such very fast comparators typically require a very short channel (on the order of 0.18 microns) and high-speed complimentary metal-oxide-semiconductor (CMOS) technology.

Rather than minimizing the magnitude of the comparator propagation delay to generate a precise relaxation oscillator output frequency, an alternative is to minimize temperature and voltage variation of the comparator's propagation delay and/or use trimming technology to reduce process variation. However, this approach limits the uppermost oscillation frequency achievable and adds to manufacturing expense.

There is, therefore, a need in the art for improved implementation of comparator-based relaxation oscillators.

SUMMARY

A relaxation oscillator includes a capacitor connected to a comparator input, current sources switched to supply power to the capacitor based on an output of the comparator, and a duplicate integrator shifting a voltage on the capacitor to offset a propagation delay through the comparator. The duplicate integrator includes current sources and a capacitor matching and switched in tandem with those within the relaxation oscillator, plus an additional current source, and is selectively switched into connection with the comparator input. By canceling the comparator propagation delay, the oscillator output frequency can be stably controlled through selection of resistive and capacitive values, using cheaper technology and tolerating large temperature, voltage and process variations.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Figure 1:
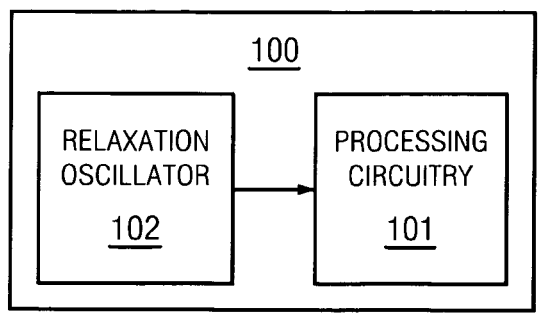
FIG. 1 illustrates an integrated circuit device including a comparator-based relaxation oscillator with comparator propagation delay cancellation in accordance with one embodiment of the present disclosure.

FIG. 1 illustrates an integrated circuit device including a comparator-based relaxation oscillator with comparator propagation delay cancellation in accordance with one embodiment of the present disclosure. Integrated circuit device 100 includes processing circuitry 101, such as encoding or decoding circuitry. A comparator-based relaxation oscillator 102 provides a reference frequency to processing circuitry 101, for use in processing signals such as wireless communication signals or video data signals. A precise and stable reference frequency is provided by relaxation oscillator through comparator delay cancellation as described in further detail below.

Those skilled in the art will recognize that the complete structure and operation of an integrated circuit device employing a relaxation oscillator is not depicted in FIG. 1 or described herein. Instead, for simplicity and clarity, only so much of an integrated circuit device as is unique to the present disclosure or necessary for an understanding of the present disclosure is depicted and described. In addition, although described in the context of an integrated circuit device, the principles of the present disclosure may be applied in other context, employing discrete components or the like.

Figure 2:
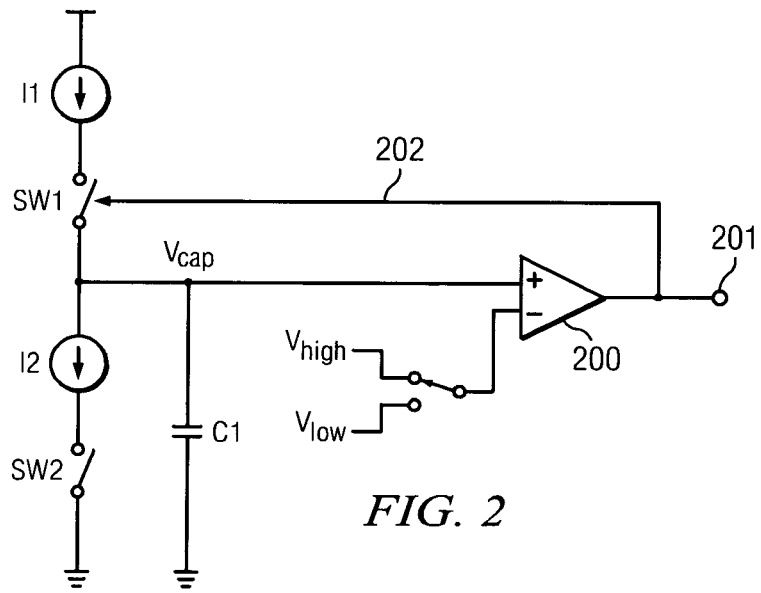
FIG. 2 is a simplified circuit diagram of a comparator-based relaxation oscillator.

FIG. 2 is a simplified circuit diagram of a comparator-based relaxation oscillator. Current sources I1 and I2 each delivering a current I and switches SW1 and SW2 (which are switched in tandem) are connected in series between a power supply voltage and ground. A capacitor C1 having a capacitance C is connected in parallel with current source I2 and switch SW2, between ground and a node $V_{cap}$. The capacitor C1 is selectively charged and discharged by current sources I1 and I2 as a result of switches SW1 and SW2 being opened and closed. One input for a comparator 200 is connected to node $V_{cap}$, and the other input is selectively connected to a reference voltage $V_{ref}$ selectively switched between $V_{high}$ and $V_{low}$. When the reference voltage $V_{ref}$ is $V_{high}$, the capacitor C1 is charging; when the reference voltage is $V_{low}$, the capacitor C1 is discharging. The intrinsic resistance within devices and connections provides the resistive component of the RC time delay. The output of the comparator 200 provides an output signal 201 for the oscillator, and a feedback signal 202 controls switching of the current sources I1 and I2 into and out of connection with capacitor C1.

Figure 2A:
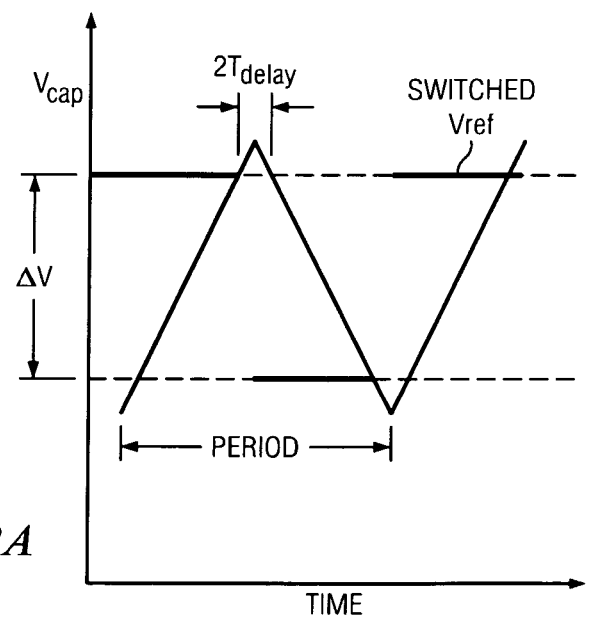
FIG. 2A illustrates the voltages as a function of time at the inputs of the comparator within the comparator-based relaxation oscillator of FIG. 2.

FIG. 2A illustrates the voltages as a function of time at the inputs of the comparator 200 within the comparator-based relaxation oscillator of FIG. 2. The reference voltage $V_{ref}$ at the negative input is switched at a predetermined period between $V_{high}$ and $V_{low}$ separated by a difference $\Delta V$. As a result, the voltage $V_{cap}$ across capacitor C1 cycles with effectively the same period. However, the propagation delay $T_{delay}$ through comparator 200 results in capacitor C1 charging and discharging more than the voltage difference $\Delta V$. This propagation delay is added into the period of the oscillator output, such that the period of the output signal 201 is:

$$\text{Period} = C\Delta V/I + 4*T_{delay}, \text{ or} \qquad (1)$$

$$\text{Period} = RC + 4*T_{delay}, \qquad (2)$$

where RC is the time constant defined by the resistive and capacitive values of the circuit and can be made stable using current technology. However the propagation delay $T_{delay}$ varies based on the factors described above, and introduces imprecision into the period of output signal 201. Removing the propagation delay $T_{delay}$ would allow the oscillator period to be defined solely by the resistive and capacitive values. Accordingly, instead of trying to control or minimize such propagation delay $T_{delay}$, that delay time is extracted and compensated for using feedback. In that way, even when the comparator delay changes, that delay is always canceled out from the oscillator period.

Figure 3A:
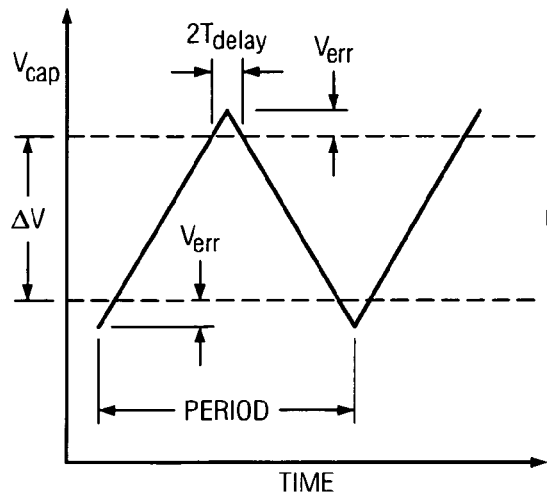
FIGS. 3A and 3B illustrate comparator propagation delay cancellation within a comparator-based relaxation oscillator in accordance with one embodiment of the present disclosure.
Figure 3B:
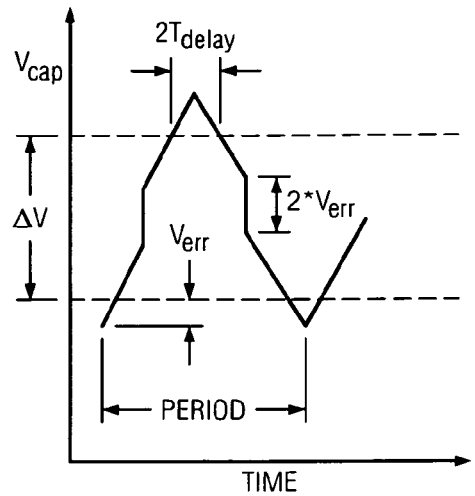

FIGS. 3A and 3B illustrate comparator propagation delay cancellation within a comparator-based relaxation oscillator in accordance with one embodiment of the present disclosure. As illustrated in FIG. 3A, the propagation delay $T_{delay}$ causes the capacitor C1 to excessively charge/discharge by a voltage $V_{err}$ determined from:

$$V_{err} = (I/C)*T_{delay}, \qquad (3)$$

where the current I is the output of both current sources I1 and I2. Over a half period, the resulting voltage difference is approximately $\Delta V + 2*V_{err}$. To compensate for the propagation delay induced error, the voltage difference $\Delta V$ is adjusted to make a voltage swing on the capacitor C1 be:

$$\Delta V_{new} = (\Delta V - 2*V_{err}) \qquad (4)$$

As illustrated in FIG. 3B, shifting the voltage on capacitor C1 up/down by $2*V_{err}$ is equivalent to making $\Delta V_{new} = (\Delta V - 2*V_{err})$.

Figure 4:
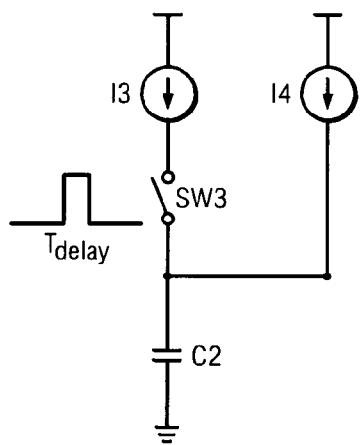
FIG. 4 is a circuit for generating a comparator propagation delay cancellation voltage within a comparator-based relaxation oscillator in accordance with one embodiment of the present disclosure.

FIG. 4 is a circuit for generating a comparator propagation delay cancellation voltage within a comparator-based relaxation oscillator in accordance with one embodiment of the present disclosure. Using current sources I3 and I4 matched to current sources I1 and I2 and a capacitor C2 matched with capacitor C1, and switching switch SW3 for a pulse duration $T_{delay}$, a voltage V is generated having the value $V_{err}$:

$$V = (I/C)*T_{delay}. \qquad (5)$$

Figure 4A:
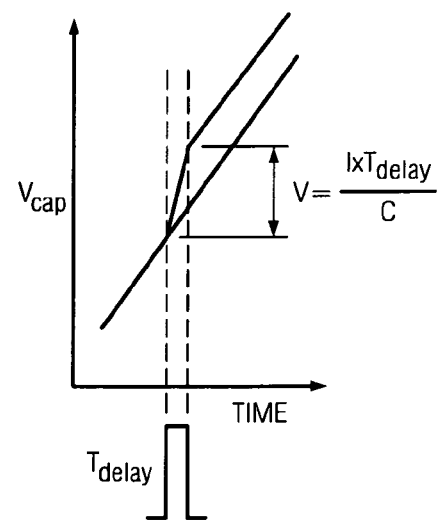
FIG. 4A illustrates the capacitor voltage shift generated by the circuit of FIG. 4.

Since $T_{delay}$ introduces $V_{err}$, the exact same propagation delay $T_{delay}$ is employed to regenerate $V_{err}$ and compensate the voltage swing on node $V_{cap}$. FIG. 4A illustrates the capacitor voltage shift generated by the circuit of FIG. 4.

Figure 5:
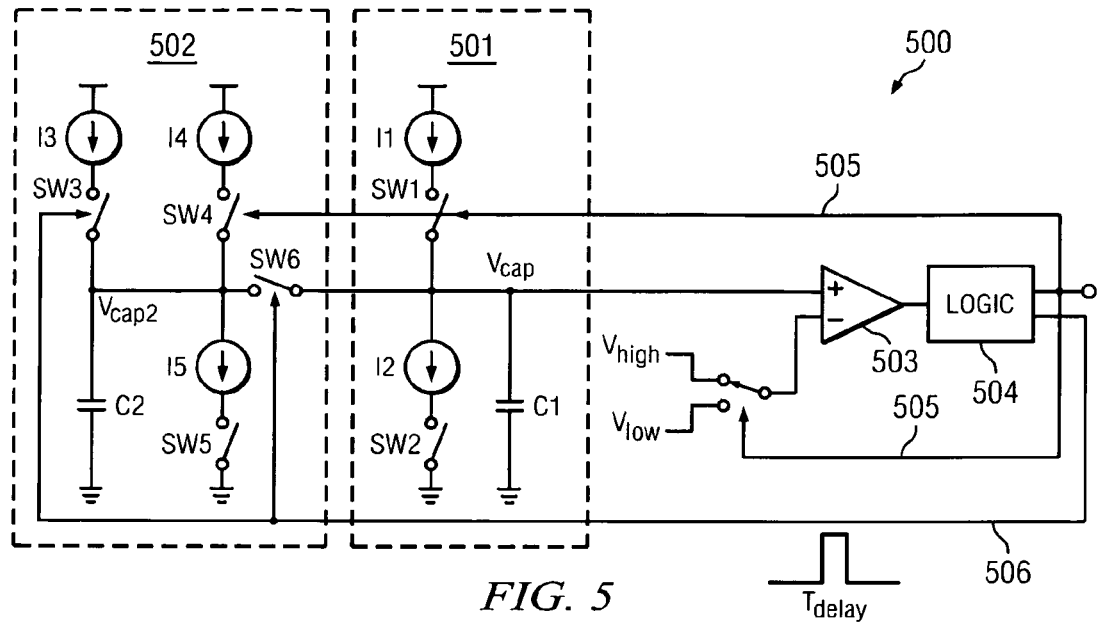
FIG. 5 is a simplified circuit diagram of a relaxation oscillator with comparator propagation delay cancellation in accordance with one embodiment of the present disclosure.

FIG. 5 is a simplified circuit diagram of a comparator-based relaxation oscillator with comparator propagation delay cancellation in accordance with one embodiment of the present disclosure. Relaxation oscillator 500 includes a main integrator 501 and a duplicate integrator 502. Main integrator 501 includes current sources I1 and I2 each generating current I and switches SW1 and SW2 connected in series between a power supply voltage and ground. Main integrator 501 also includes a capacitor C1 having capacitance C connected in parallel with current source I2 and switch SW2, between node $V_{cap}$ and ground.

Duplicate integrator 502 includes current sources I4 and I5 each generating current I and switches SW4 and SW5 connected in series between the power supply voltage and ground, in parallel with current sources I1 and I2 and switches SW1 and SW2 and having a similar node $V_{cap2}$. Switches SW1, SW2, SW4 and SW5 are all switched in tandem. Duplicate integrator 502 also includes a capacitor C2 having capacitance C connected in parallel with current source I5 and switch SW5, between node $V_{cap2}$ and ground. Duplicate integrator 502 further includes a current source I3 generating current I and a switch SW3 selectively connecting current source I3 to node $V_{cap2}$. Another switch SW6 selectively connects node $V_{cap2}$ to node $V_{cap}$. Switches SW3 and SW6 are switched in tandem.

Node $V_{cap}$ is connected to one input of comparator 503, with the other comparator input switched between reference voltage $V_{ref}$ values of $V_{high}$ and $V_{low}$, delayed relative to current source switching by switches SW1, SW2, SW4 and SW5 as described in further detail below. Logic 504 connected to the output of comparator 503 generates one signal 505 for controlling switches SW1, SW2, SW4 and SW5 (which is also the output of the relaxation oscillator) and a second signal 506 controlling switches SW3 and SW6. Signal 506 has a pulse duration of $T_{delay}$ recurring every half-period of the oscillation.

Similar to the circuit of FIG. 4 described above, duplicate integrator 502 generates a voltage shift for application to node $V_{cap}$ to cancel comparator propagation delay and render the oscillator output frequency dependent solely on the resistive and capacitive values. Delay cancellation cannot be applied directly to the main integrator 501 while generating the $T_{delay}$ pulse, or else the comparator 503 will see different slew rates on the input terminal, hence affecting $T_{delay}$. Thus, in the exemplary embodiment of FIG. 5, a separate charging/discharging current and capacitor integrator 502 is employed to compensate for comparator propagation delay induced error. When the $T_{delay}$ pulse is active, delay cancellation is enabled on the duplicate integrator 502 but not on the main integrator 501. At the falling edge of the $T_{delay}$ pulse, delay cancellation finishes and the charge on the duplicate integrator 502 is transferred to the main integrator 501. The voltage at node $V_{cap}$ of the main integrator 501 is then shifted up by an amount proportional to the $T_{delay}$ pulse duration. Logic 504 delays $V_{ref}$ switching as described below, and extracts the two $T_{delay}$ pulses per period.

Figure 5A:
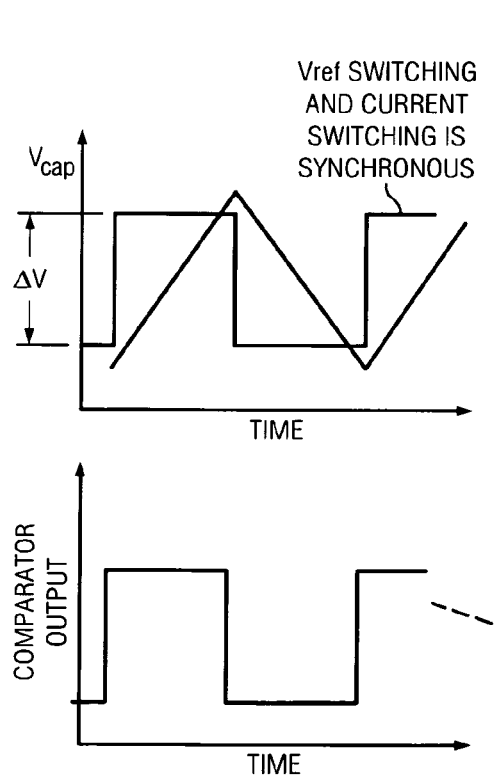
FIGS. 5A and 5B are comparative illustrations of the capacitor voltage and comparator output as a function of time for the circuit of FIG. 5.
Figure 5B:
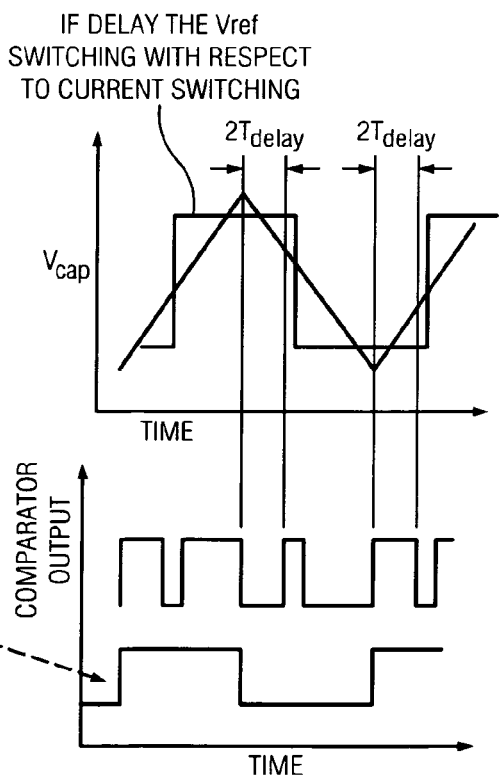

FIGS. 5A and 5B are comparative illustrations of the capacitor voltage and comparator output as a function of time for the circuit of FIG. 5. In FIG. 5A, $V_{ref}$ switching and current switching using switches SW1, SW2, SW4 and SW5 are synchronous. Transitions in capacitor voltage $V_{cap}$ and $V_{ref}$ input occur concurrently. To cancel comparator propagation delay, $V_{ref}$ switching is delayed relative to transitions in the capacitor voltage by at least $2*T_{delay}$.

Figure 6:
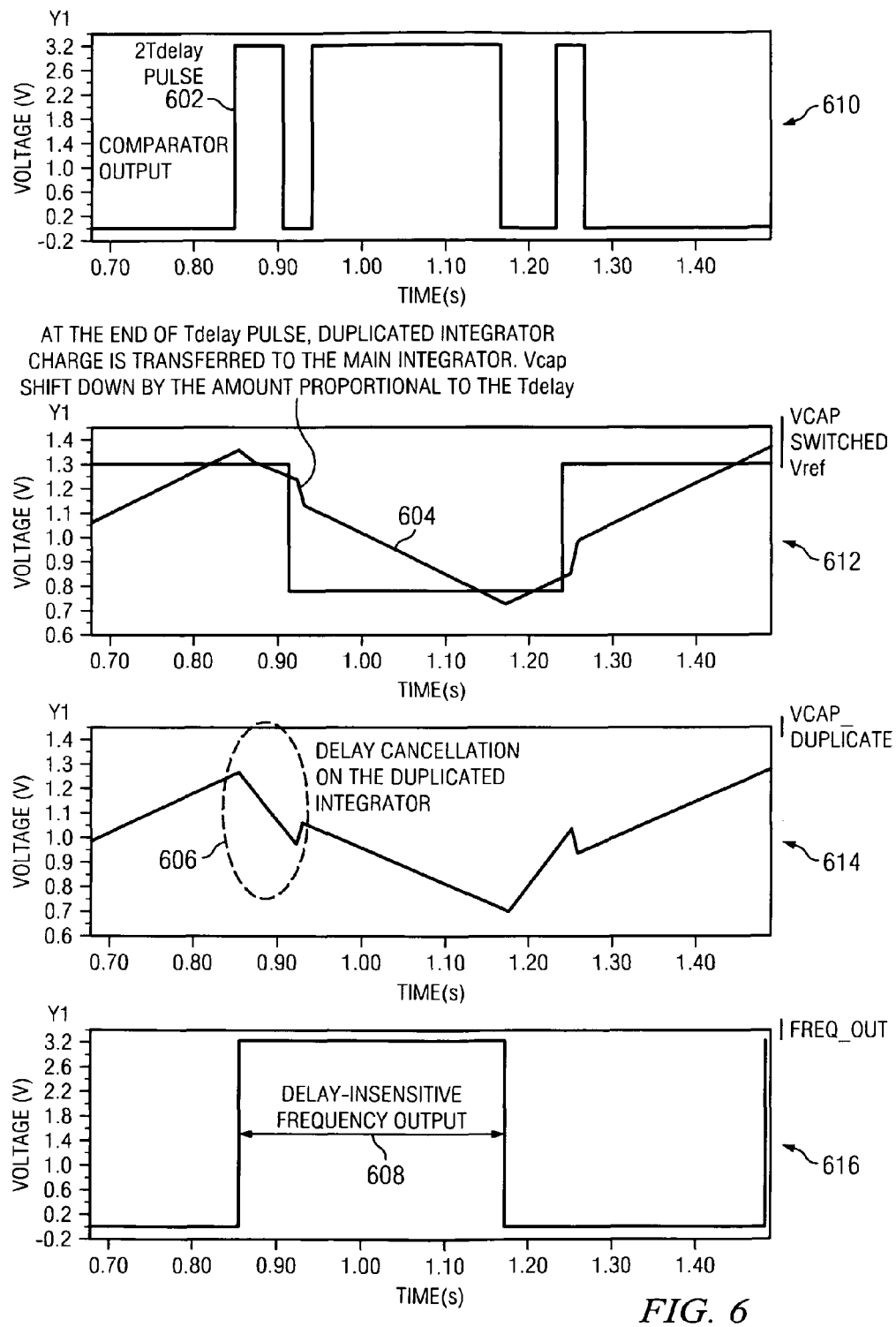
FIG. 6 is a set of timing diagrams for simulated operation of the circuit of FIG. 5.

FIG. 6 is a set of timing diagrams for simulated operation of the circuit of FIG. 5. Plot 610 illustrates the output of comparator 500, including the $2*T_{delay}$ pulses. Plot 612 illustrates both the capacitor voltage $V_{cap}$ (generally sawtooth waveform) and $V_{ref}$ switching (square waveform). At the end of the $T_{delay}$ pulse, the charge accumulated on the duplicate integrator 502 is transferred to the main integrator 501, with the result that the capacitor voltage $V_{cap}$ is shifted by an amount proportional to $T_{delay}$. Plot 614 illustrates voltage $V_{cap2}$ on capacitor C2 of the duplicate integrator. Plot 616 illustrates the relaxation oscillator output, with delay-insensitive frequency.

The precision of the all-silicon based oscillator 500 described above is not limited by the accuracy of the comparator's propagation delay, which can vary widely with temperature, voltage and process degrading performance. Comparator propagation delay may be as much as 25% of the desired oscillation period without affecting the output frequency of the relaxation oscillator. In addition, with comparator propagation delay cancellation, cheaper and slower CMOS technology is sufficient, translating into overall cost savings.

"Real-time" delay compensation as described above renders the oscillator output frequency insensitive to comparator propagation delay. The circuit overhead is only the logic 504, current sources I3, I4 and I5, switches SW5 and SW6, and integrating capacitor C2. In addition, relaxation oscillators are traditionally used as current-to-frequency converters, such that delay cancellation improves the current-to-frequency conversion accuracy and dynamic range.

Although the above description is made in connection with specific exemplary embodiments, various changes and modifications will be apparent to and/or suggested by the present disclosure to those skilled in the art. Tt is intended that the present disclosure encompass all such changes and modifications as fall within the scope of the appended claims.

What is claimed is:

1. A relaxation oscillator with comparator propagation delay compensation, comprising:
a first capacitor coupled between a first node and a ground voltage;
a comparator having a first input coupled to the first node, wherein, during operation, transitions in an output signal of the comparator are delayed relative to transitions in the signal on the first node by a comparator propagation delay;
a first plurality of current sources configured to selectively supply power to the capacitor, the current sources switched based on an output of the comparator; and
logic and a propagation delay integrator configured to generate a compensation voltage proportional to the comparator propagation delay and to shift a voltage on the capacitor by the compensation voltage, wherein a second input of the comparator is configured to be switched between high and low reference voltages based on an output of the comparator and the logic delays switching of the second input relative to switching of the current sources by a duration based on the comparator propagation delay.

2. The relaxation oscillator of claim 1, wherein the logic generates pulses based on the comparator propagation delay.

3. The relaxation oscillator of claim 1, wherein switching of the second input is delayed relative to switching of the current sources by a duration greater than the comparator propagation delay.

4. The relaxation oscillator of claim 3, wherein the logic delays switching of the second input relative to switching of the current sources by at least twice the comparator propagation delay.

5. An integrated circuit device including the relaxation oscillator of claim 1, the integrated circuit device further comprising:
processing circuitry; and
a connection between the processing circuitry and the relaxation oscillator,
wherein the processing circuitry is configured to process data based on an output of the relaxation oscillator.

6. A relaxation oscillator with comparator propagation delay compensation, comprising:
a first capacitor coupled between a first node and a ground voltage;
a comparator having a first input coupled to the first node, wherein, during operation, transitions in an output signal of the comparator are delayed relative to transitions in the signal on the first node by a comparator propagation delay;
a first plurality of current sources configured to selectively supply power to the capacitor, the current sources switched based on an output of the comparator; and
logic and a propagation delay integrator configured to generate a compensation voltage proportional to the comparator propagation delay and to shift a voltage on the capacitor by the compensation voltage, wherein the propagation delay integrator further comprises:

a second capacitor coupled between a voltage accumulation node and the ground voltage, the second capacitor accumulating the compensation voltage during a period based on the comparator propagation delay;

a second plurality of current sources configured to selectively supply power to the propagation delay integrator capacitor, the second current sources switched based on an output of the comparator; and an additional current source configured to selectively supply power to the propagation delay integrator capacitor, the additional current source switched based upon the comparator propagation delay, wherein the voltage accumulation node is configured to be selectively coupled to the first node to shift the voltage on the capacitor by the compensation voltage.

7. The relaxation oscillator of claim 6, wherein the voltage accumulation node is configured to be switched into connection with the first node based upon the comparator propagation delay.

8. A method of compensating for comparator propagation delay within a relaxation oscillator, comprising:

selectively charging and discharging a first capacitor coupled between a first node and a ground voltage;

receiving a voltage across the first capacitor at a first input of a comparator, the first input coupled to the first node, wherein, during operation, transitions in an output signal of the comparator are delayed relative to transitions in the signal on the first node by a comparator propagation delay;

selectively supply power to the capacitor using a first plurality of current sources, the current sources switched based on an output of the comparator;

generating a compensation voltage proportional to the comparator propagation delay using a propagation delay integrator; and shifting a voltage on the capacitor by the compensation voltage, wherein a second input of the comparator is configured to be switched between high and low reference voltages based on an output of the comparator, wherein logic coupled to an output of the comparator delays switching of the second input relative to switching of the current sources by a duration based on the comparator propagation delay.

9. The method of claim 8, wherein switching of the second input is delayed relative to switching of the current sources by a duration greater than the comparator propagation delay.

10. The method of claim 9, wherein the logic delays switching of the second input relative to switching of the current sources by at least twice the comparator propagation delay.

11. A method of compensating for comparator propagation delay within a relaxation oscillator, comprising:

selectively charging and discharging a first capacitor coupled between a first node and a ground voltage;

receiving a voltage across the first capacitor at a first input of a comparator, the first input coupled to the first node, wherein, during operation, transitions in an output signal of the comparator are delayed relative to transitions in the signal on the first node by a comparator propagation delay;

selectively supplying power to the capacitor using a first plurality of current sources, the current sources switched based on an output of the comparator;

generating a compensation voltage proportional to the comparator propagation delay using a propagation delay integrator configured to:

accumulate the compensation voltage on a second capacitor coupled between a voltage accumulation node and the ground voltage, the compensation voltage accumulated during a period based on the comparator propagation delay, selectively supply power to the propagation delay integrator capacitor from a second plurality of current sources, the second current sources switched based on an output of the comparator, and selectively supply power to the propagation delay integrator capacitor from an additional current source, the additional current source switched based upon the comparator propagation delay, wherein the voltage accumulation node is configured to be selectively coupled to the first node to shift the voltage on the capacitor by the compensation voltage; and shifting a voltage on the capacitor by the compensation voltage.

12. The method of claim 11, wherein the voltage accumulation node is configured to be switched into connection with the first node based upon the comparator propagation delay.

13. The method of claim 11, further comprising:
generating pulses based on the comparator propagation delay.

14. The method of claim 11, further comprising:
processing data based on an output of the relaxation oscillator.

15. A relaxation oscillator with comparator propagation delay compensation, comprising:

a first capacitor coupled between a first node and a ground voltage;

a comparator having a first input coupled to the first node, wherein, during operation, transitions in an output signal of the comparator are delayed relative to transitions in the signal on the first node by a comparator propagation delay;

a first switch configured to selectively connect a first current source to the first node;

a second switch configured to selectively connect a second current source to the first node;

a second capacitor coupled between a second node and the ground voltage;

a third switch configured to selectively connect a third current source to the first node;

a fourth switch configured to selectively connect a fourth current source to the first node;

a fifth switch configured to selectively connect a fifth current source to the first node;

a sixth switch configured to selectively connect the second node to the first node, wherein closing the sixth switch results in a voltage shift at the first node, wherein the first, second, fourth and fifth switches are switched in tandem based on transitions in an output of the comparator, and wherein the third and sixth switches are switched in tandem based on a propagation delay through the comparator, the voltage shift compensating for the propagation delay; and logic coupled to the output of the comparator, wherein the logic delays switching of the third and sixth switches relative to switching of the first, second, fourth and fifth switches by a duration based on the comparator propagation delay.

16. The relaxation oscillator of claim 15,
wherein the logic is configured to generate pulses based on the comparator propagation delay.

17. The relaxation oscillator of claim 16, wherein third and sixth switches are configured to be controlled by the pulses generated by the logic.

18. The relaxation oscillator of claim 16, wherein a second input of the comparator is configured to be switched between high and low reference voltages based on an output of the comparator, wherein switching of the second input is delayed relative to switching of the first, second, fourth and fifth switches by a duration greater than the comparator propagation delay.

19. The relaxation oscillator of claim 17, wherein the logic delays switching of the second input relative to switching of the switching of the first, second, fourth and fifth switches by at least twice the comparator propagation delay.

20. An integrated circuit device including the relaxation oscillator of claim 15, the integrated circuit device further comprising:
 processing circuitry; and
 a connection between the processing circuitry and the relaxation oscillator,
 wherein the processing circuitry is configured to process data based on an output of the relaxation oscillator.

* * * * *